United States Patent
Kim et al.

(10) Patent No.: US 10,538,699 B2
(45) Date of Patent: Jan. 21, 2020

(54) LIGHTING DEVICE HAVING A PHOTOCONVERSION LAYER

(71) Applicant: SAMSUNG DISPLAY CO., LTD., Yongin-si, Gyeonggi-Do (KR)

(72) Inventors: Dongchan Kim, Yongin-si (KR); Yisu Kim, Yongin-si (KR); Byoungduk Lee, Yongin-si (KR); Yoonhyeung Cho, Yongin-si (KR); Yongchan Ju, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 278 days.

(21) Appl. No.: 15/456,661

(22) Filed: Mar. 13, 2017

(65) Prior Publication Data

US 2017/0356623 A1  Dec. 14, 2017

(30) Foreign Application Priority Data

Jun. 9, 2016  (KR) .................. 10-2016-0071732

(51) Int. Cl.
| | |
|---|---|
| *C09K 11/06* | (2006.01) |
| *C09K 11/77* | (2006.01) |
| *F21V 13/00* | (2006.01) |
| *F21V 8/00* | (2006.01) |

(52) U.S. Cl.
CPC .......... *C09K 11/06* (2013.01); *C09K 11/7791* (2013.01); *F21V 13/00* (2013.01); *G02B 6/005* (2013.01); *C09K 2211/10* (2013.01); *C09K 2211/182* (2013.01)

(58) Field of Classification Search
CPC .......... H01L 33/502; F21V 9/30; F21V 13/00; C09K 11/06; C09K 11/7791; C09K 11/665; C09K 11/616; C09K 2011/10
See application file for complete search history.

(56) References Cited

U.S. PATENT DOCUMENTS

| | | | |
|---|---|---|---|
| 4,089,799 A | 5/1978 | Soomerdijk et al. | |
| 5,882,548 A | 3/1999 | Liang et al. | |
| 8,096,668 B2 * | 1/2012 | Abu-Ageel | G02B 3/0006 362/296.01 |
| 2012/0113671 A1 | 5/2012 | Sadasivan et al. | |
| 2015/0071319 A1 | 3/2015 | Xing et al. | |
| 2015/0136232 A1 | 5/2015 | Snaith et al. | |
| 2017/0054099 A1 | 2/2017 | Friend et al. | |
| 2017/0155020 A1 * | 6/2017 | Lin | H01L 33/507 |

FOREIGN PATENT DOCUMENTS

| | | |
|---|---|---|
| KR | 10-2011-0012246 | 2/2011 |
| KR | 10-2013-0099045 | 9/2013 |
| KR | 10-2015-0011002 | 1/2015 |
| WO | 2011097137 | 8/2011 |
| WO | 2015166006 | 11/2015 |
| WO | 2016009450 | 1/2016 |
| WO | WO 2017/108568 | * 6/2017 |

OTHER PUBLICATIONS

Zhang et al, "Brightly Luminescet and Color-Tunable Colloidal CH3NH3PBX3 (X—Br, I, Cl) Quantum Dots: Potential Alternatives for Display Technology", ACS Nano, vol. 9, No. 4, pp. 4533-4542, Mar. 30, 2015.*

Pathak et al, "Perovskite Crystals for Tunable White Light Emission", Chem. Mater. 2015, 27, pp. 8066-8075, Nov. 4, 2015.*

Palazon et al, "Polymer-Free Films of Inorganic Halide Perovskite Nanocrystals as UV-to-White Color-Conversion Layers in LEDs", Chem. Mater. 2016, 28, pp. 2902-2906, Apr. 19, 2016.*

Song et al., "Quantum Dot Light-Emitting Diodes Based on Inorganic Perovskite Cesium Lead Halides (CsPbX3)", Advanced Materials, vol. 27, (44), 2015, pp. 1-6.

Cho et al., "Overcoming the Electroluminescence Efficiency Limitations of Perovskite Light-Emitting Diodes." sciencemag.org, vol. 350, Issue 6265, Dec. 2015, pp. 1222-1225.

Zhang et al., "Brightly Luminescent and Color-Tunable Colloidal CH3NH3PbX3 (X=Br, I, Cl) Quantum Dots: Potential Alternatives for Display Technology", ACS Nano, vol. 9, No. 4, 2015, pp. 4533-4542.

Protesescu, et al., "Nanocrystals of Cesium Lead Halide Perovskites (CsPbX3, X=Cl, Br, and I): Novel Optoelectronic Materials Showing Bright Emission with Wide Color Gamut", Nano Letters, vol. 15 (2015), pp. 3692-3696.

S.H. Wang, et al., "A New Synthesis Route for Perovskite-Type Iodides", Journal of the Less-Common Metals, 149 (1989), pp. 55-61.

European Search Report dated Oct. 13, 2017 in corresponding European Application No. 17174599.5, 9 pages.

* cited by examiner

*Primary Examiner* — C Melissa Koslow

(74) *Attorney, Agent, or Firm* — F. Chau & Associates, LLC

(57) ABSTRACT

A lighting device includes a light source and a photoconversion layer including a perovskite compound represented by Formula 1. The perovskite compound absorbs at least part of light emitted from the light source and emits light having a different wavelength range from the absorbed light:

$$[A][B][X]_3 \qquad \text{<Formula 1>}$$

In Formula 1, A is at least one monovalent organic cation, at least one a monovalent inorganic cation, or any combination thereof, B is at least one divalent inorganic cation, and X is at least one monovalent anion.

19 Claims, 2 Drawing Sheets

LIGHTING DEVICE HAVING A PHOTOCONVERSION LAYER

CROSS-REFERENCE TO RELATED APPLICATION

This application claims priority under 35 U.S.C. § 119 to Korean Patent Application No. 10-2016-0071732, filed on Jun. 9, 2016, in the Korean Intellectual Property Office, the disclosure of which is incorporated by reference herein in its entirety.

1. TECHNICAL FIELD

Exemplary embodiments of the present invention relate to a lighting device, and more particularly, to a lighting device having a photoconversion layer.

2. DISCUSSION OF RELATED ART

Lighting devices may be used in a variety of applications. For example, lighting devices may be used for indoor or outdoor lighting, stage lighting, or decorative lighting or as a backlight unit (BLU) of a liquid crystal display (LCD) used in portable electronic devices such as mobile phones, camcorders, digital cameras, and personal digital assistants (PDA).

As an example, a lighting device for use as a backlight unit of a liquid crystal display may include white-light emitting devices that emit white light. White light may be emitted by a combination of blue light-emitting diodes (LED) and yellow phosphors or quantum dots, by a combination of blue LED and green/red phosphors or quantum dots, or by a combination of ultraviolet (UV) LED and blue/green/red phosphors or quantum dots.

SUMMARY

One or more exemplary embodiments of the present invention include a lighting device having a photoconversion layer.

According to one or more exemplary embodiments of the present invention, a lighting device includes a light source and a photoconversion layer including a perovskite compound represented by Formula 1. The perovskite compound absorbs at least part of light emitted from the light source and emits light having a different wavelength range from the absorbed light:

$$[A][B][X]_3 \quad \text{<Formula 1>}$$

In Formula 1, A is at least one monovalent organic cation, at least one a monovalent inorganic cation, or any combination thereof, B is at least one divalent inorganic cation, and X is at least one monovalent anion.

BRIEF DESCRIPTION OF THE DRAWINGS

The above and other features of the present invention will become more apparent by describing in detail exemplary embodiments thereof, with reference to the accompanying drawings, in which.

DETAILED DESCRIPTION

Figure 1:
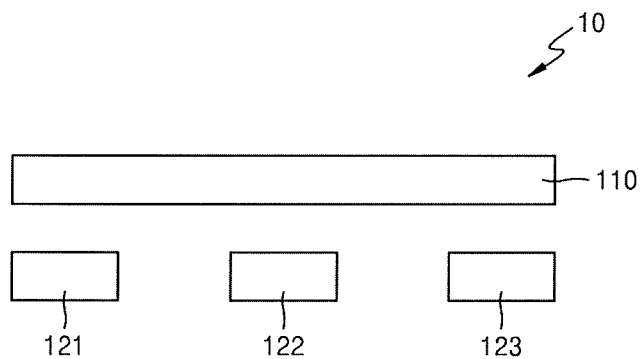
FIGS. 1 and 2 are schematic views illustrating structures of lighting devices according to exemplary embodiments of the present invention.

Exemplary embodiments of the present invention will be described below in more detail with reference to the accompanying drawings. In this regard, the exemplary embodiments may have different forms and should not be construed as being limited to the exemplary embodiments of the present invention described herein.

Although the terms "first" and "second" may be used herein to describe various elements, components, regions, and/or layers, these elements, components, regions, and/or layers should not be limited by these terms.

According to some exemplary embodiments of the present invention, a lighting device includes a light source and a photoconversion layer including a perovskite compound represented by Formula 1. The perovskite compound may absorb at least part of light emitted from the light source and may emit light having a different wavelength range from the absorbed light.

$$[A][B][X]_3 \quad \text{<Formula 1>}$$

As used herein, the term "perovskite compound" refers to a compound having a perovskite crystal structure. A perovskite crystal structure refers to a 3-dimensional (3D) crystal structure that corresponds with the crystal structure of $CaTiO_3$.

In Formula 1, A may be at least one monovalent organic cation, at least one monovalent inorganic cation, or any combination thereof. For example, A may be one monovalent organic cation, one monovalent inorganic cation, a combination of at least two different monovalent organic cations, a combination of at least two different monovalent inorganic cations, or a combination of at least one monovalent organic cation and at least one monovalent inorganic cation.

In some exemplary embodiments of the present invention, in Formula 1, A may be $(R_1R_2R_3C)^+$, $(R_1R_2R_3R_4N)^+$, $(R_1R_2R_3R_4P)^+$, $(R_1R_2R_3R_4As)^+$, $(R_1R_2R_3R_4Sb)^+$, $(R_1R_2N=C(R_3)-NR_4R_5)^+$, a substituted or unsubstituted cycloheptatrienium, a substituted or unsubstituted nitrogen-containing 5-membered cyclic monovalent cation, a substituted or unsubstituted nitrogen-containing 6-membered cyclic monovalent cation, $Li^+$, $Na^+$, $K^+$, $Rb^+$, $Cs^+$, $Fr^+$, or any combination thereof.

$R_1$ to $R_5$ may be each independently selected from a hydrogen, a deuterium (-D), —F, —Cl, —Br, —I, a hydroxyl group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_6$-$C_{60}$ aryl group, or —$N(Q_1)(Q_2)$, At least one substituent of the substituted cycloheptatrienium, the substituted nitrogen-containing 5-membered cyclic monovalent cation, and the substituted nitrogen-containing 6-membered cyclic monovalent cation may be selected from a deuterium, —F, —Cl, —Br, —I, a hydroxyl group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_6$-$C_{60}$ aryl group, or —$N(Q_3)(Q_4)$.

$Q_1$ to $Q_4$ may be each be independently selected from a hydrogen, a deuterium, a hydroxyl group, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_6$-$C_{60}$ aryl group.

As used herein, the phrases "nitrogen-containing 5-membered cyclic" and "nitrogen-containing 6-membered cyclic" refer to an organic cyclic group including at least one nitrogen (N) and at least one carbon (C) atom as ring-member atoms.

For example, the "nitrogen-containing 5-membered cyclic" group may be an imidazole, a pyrazole, a thiazole, an oxazole, a pyrrolidine, a pyrroline, a pyrrole, or a triazole, and the "nitrogen-containing 6-membered cyclic" group may be a pyridine, a pyridazine, a pyrimidine, a pyrazine, or a piperidine. However, exemplary embodiments of the present invention are not limited thereto.

For example, in Formula 1, A may be $(R_1R_2R_3C)^+$, $(R_1R_2R_3R_4N)^+$, $(R_1R_2R_3R_4P)^+$, $(R_1R_2R_3R_4As)^+$, $(R_1R_2R_3R_4Sb)^+$, $(R_1R_2N=C(R_3)-NR_4R_5)^+$, a substituted or unsubstituted cycloheptatrienium, a substituted or unsubstituted imidazolium, a substituted or unsubstituted pyridinium, a substituted or unsubstituted pyridazinium, a substituted or unsubstituted pyrimidinium, a substituted or unsubstituted pyrazinium, a substituted or unsubstituted pyrazolium, a substituted or unsubstituted thiazolium, a substituted or unsubstituted oxazolium, a substituted or unsubstituted piperidinium, a substituted or unsubstituted pyrrolidinium, a substituted or unsubstituted pyrrolinium, a substituted or unsubstituted pyrrolium, a substituted or unsubstituted triazolium, $Li^+$, $Na^+$, $K^+$, $Rb^+$, $Cs^+$, $Fr^+$, or any combination thereof, $R_1$ to $R_5$ may be each independently selected from:

a hydrogen, a deuterium, —F, —Cl, —Br, —I, a hydroxyl group, a $C_1$-$C_{20}$ alkyl group, or a $C_1$-$C_{20}$ alkoxy group;

a $C_1$-$C_{20}$ alkyl group and a $C_1$-$C_{20}$ alkoxy group, each substituted with at least one selected from a deuterium, —F, —Cl, —Br, —I, or a hydroxyl group;

a phenyl group, a naphthyl group, a biphenyl group, or a terphenyl group;

a phenyl group, a naphthyl group, a biphenyl group, and a terphenyl group, each substituted with at least one selected from a deuterium, —F, —Cl, —Br, —I, a hydroxyl group, a $C_1$-$C_{20}$ alkyl group, or a $C_1$-$C_{20}$ alkoxy group; and

—$N(Q_1)(Q_2)$.

At least one substituent of the substituted cycloheptatrienium, the substituted imidazolium, at least one substituent of the substituted pyridinium, at least one substituent of the substituted pyridazinium, at least one substituent of the substituted pyrimidinium, at least one substituent of the substituted pyrazinium, at least one substituent of the substituted pyrazolium, at least one substituent of the substituted thiazolium, at least one substituent of the substituted oxazolium, at least one substituent of the substituted piperidinium, at least one substituent of the substituted pyrrolidinium, at least one substituent of the substituted pyrrolinium, at least one substituent of the substituted pyrrolium, and at least one substituent of the substituted triazolium may be selected from:

a deuterium, —F, —Cl, —Br, —I, a hydroxyl group, a $C_1$-$C_{20}$ alkyl group, or a $C_1$-$C_{20}$ alkoxy group;

a $C_1$-$C_{20}$ alkyl group and a $C_1$-$C_{20}$ alkoxy group, each substituted with at least one selected from a deuterium, —F, —Cl, —Br, —I, or a hydroxyl group;

a phenyl group, a naphthyl group, a biphenyl group, or a terphenyl group;

a phenyl group, a naphthyl group, a biphenyl group, and a terphenyl group, each substituted with at least one selected from a deuterium, —F, —Cl, —Br, —I, a hydroxyl group, a $C_1$-$C_{20}$ alkyl group, or a $C_1$-$C_{20}$ alkoxy group; and

—$N(Q_3)(Q_4)$ $Q_1$ to $Q_4$ may be each independently be selected from a hydrogen, a deuterium, a hydroxyl group, a $C_1$-$C_{20}$ alkyl group, a $C_1$-$C_{20}$ alkoxy group, a phenyl group, a naphthyl group, a biphenyl group, or a terphenyl group.

In some exemplary embodiments of the present invention, in Formula 1, A may be $(R_1R_2R_3R_4N)^+$, $(R_1R_2R_3R_4P)^+$, $(R_1R_2R_3R_4As)^+$, $(R_1R_2R_3R_4Sb)^+$, $Li^+$, $Na^+$, $K^+$, $Rb^+$, $Cs^+$, $Fr^+$, or any combination thereof.

$R_1$ to $R_4$ may be each independently selected from a hydrogen, a deuterium, —F, —Cl, —Br, —I, a hydroxyl group, a $C_1$-$C_{20}$ alkyl group, a $C_1$-$C_{20}$ alkoxy group, or —$N(Q_1)(Q_2)$.

$Q_1$ and $Q_2$ may each be independently selected from a hydrogen, a deuterium, a hydroxyl group, a $C_1$-$C_{20}$ alkyl group, or a $C_1$-$C_{20}$ alkoxy group.

In some exemplary embodiments of the present invention, in Formula 1, A may be $(R_1R_2R_3R_4N)^+$, $K^+$, $Rb^+$, $Cs^+$, or any combination thereof, $R_1$ to $R_4$ may be each independently selected from a hydrogen, deuterium, —F, —Cl, —Br, —I, a hydroxyl group, a $C_1$-$C_{20}$ alkyl group, a $C_1$-$C_{20}$ alkoxy group, or —$N(Q_1)(Q_2)$.

$Q_1$ and $Q_2$ may each be independently selected from a hydrogen, a deuterium, a hydroxyl group, a $C_1$-$C_{20}$ alkyl group, or a $C_1$-$C_{20}$ alkoxy group.

In some exemplary embodiments of the present invention, in Formula 1, A may be $(NH_4)^+$, $(PH_4)^+$, $(AsH_4)^+$, $(SbH_4)^+$, $(NF_4)^+$, $(PF_4)^+$, $(NCl_4)^+$, $(PCl_4)^+$, $(CH_3NH_3)^+$, $(CH_3PH_3)^+$, $(CH_3AsH_3)^+$, $(CH_3SbH_3)^+$, $((CH_3)_2NH_2)^+$, $((CH_3)_2PH_2)^+$, $((CH_3)_2AsH_2)^+$, $((CH_3)_2SbH_2)^+$, $((CH_3)_3NH)^+$, $((CH_3)_3PH)^+$, $((CH_3)_3AsH)^+$, $((CH_3)_3SbH)^+$, $((CH_3CH_2)NH_3)^+$, $((CH_3CH_2)PH_3)^+$, $((CH_3CH_2)AsH_3)^+$, $((CH_3CH_2)SbH_3)^+$, $(CH_2N_2H_4)^+$, $(C_7H_7)^+$, $(NH_3OH)^+$, $(NH_3NH_2)^+$, $((CH_2)_3NH_2)^+$, $(CH(NH_2)_2)^+$, $(C_3N_2H_5)^+$, $(NC_4H_8)^+$, $((NH_2)_3C)^+$, $K^+$, $Rb^+$, $Cs^+$, or any combination thereof. However, exemplary embodiments of the present invention are not limited thereto.

In Formula 1, B may be at least one divalent inorganic cation. For example, B in Formula 1 may be one divalent inorganic cation, or a combination of at least two different divalent inorganic cations.

In some exemplary embodiments of the present invention, B may be a divalent cation of a rare earth metal, a divalent cation of an alkaline earth metal, a divalent cation of a transition metal, a divalent cation of a late transition metal, or any combination thereof. For example, B may be $La^{2+}$, $Ce^{2+}$, $Pr^{2+}$, $Nd^{2+}$, $Pm^{2+}$, $Eu^{2+}$, $Gd^{2+}$, $Tb^{2+}$, $Ho^{2+}$, $Er^{2+}$, $Tm^{2+}$, $Yb^{2+}$, $Lu^{2+}$, $Be^{2+}$, $Mg^{2+}$, $Ca^{2+}$, $Sr^{2+}$, $Ba^{2+}$, $Ra^{2+}$, $Pb^{2+}$, $Sn^{2+}$, or any combination thereof.

In some exemplary embodiments of the present invention, B may be $Tm^{+2}$; and $La^{2+}$, $Ce^{2+}$, $Pr^{2+}$, $Nd^{2+}$, $Pm^{2+}$, $Eu^{2+}$, $Gd^{2+}$, $Tb^{2+}$, $Ho^{2+}$, $Er^{2+}$, $Yb^{2+}$, $Lu^{2+}$, $Be^{2+}$, $Mg^{2+}$, $Ca^{2+}$, $Sr^{2+}$, $Ba^{2+}$, $Ra^{2+}$, $Pb^{2+}$, $Sn^{2+}$, or any combination thereof. However, exemplary embodiments of the present invention are not limited thereto.

In Formula 1, X may be at least one monovalent anion. For example, X may be one monovalent anion, or a combination of at least two different monovalent anions.

In some exemplary embodiments of the present invention, in Formula 1, X may be at least one halide anion, for example, —F, —Cl, —Br, or —I. For example, X in Formula 1 may be at least one halide anion or a combination of at least two different halide anions.

In some exemplary embodiments of the present invention, X in Formula 1 may be an iodide ion (—I). However, exemplary embodiments of the present invention are not limited thereto.

As an example, the perovskite compound of Formula 1 may be selected from $[CH_3NH_3][Pb][I]_3$, $[CH_3NH_3][Pb_nSr_{(1-n)}][I]_3$, $[CH_3NH_3][Pb_nMg_{(1-n)}][I]_3$, $[CH_3NH_3][Pb_nCa_{(1-n)}][I]_3$, $[CH_3NH_3][Pb_nBa_{(1-n)}][I]_3$, $[CH_3NH_3][Pb_nEu_{(1-n)}][I]_3$, $[CH_3NH_3][Pb_nYb_{(1-n)}][I]_3$, $[CH_3NH_3][Pb_nTm_{(1-n)}][I]_3$, $[CH_3NH_3][Pb_nLa_{(1-n)}][I]_3$, $[CH_3NH_3][Pb_nCe_{(1-n)}][I]_3$, $[CH_3NH_3][Pb_nPr_{(1-n)}][I]_3$, $[CH_3NH_3][Pb_nNd_{(1-n)}][I]_3$, $[CH_3NH_3][Pb_nPm_{(1-n)}][I]_3$, $[CH_3NH_3][Pb_nGd_{(1-n)}][I]_3$, $[CH_3NH_3][Pb_nTb_{(1-n)}][I]_3$, $[CH_3NH_3][Pb_nHo_{(1-n)}][I]_3$, $[CH_3NH_3][Pb_nEr_{(1-n)}][I]_3$, $[Cs][Pb][I]_3$, $[Cs][Pb_nSr_{(1-n)}][I]_3$, $[Cs][Pb_nMg_{(1-n)}][I]_3$, $[Cs][Pb_nCa_{(1-n)}][I]_3$, $[Cs][Pb_nBa_{(1-n)}][I]_3$, $[Cs][Pb_nEu_{(1-n)}][I]_3$, $[CS][Pb_nYb_{(1-n)}][I]_3$, $[Cs][Pb_nTm_{(1-n)}][I]_3$, $[Cs][Pb_nLa_{(1-n)}][I]_3$, $[Cs][Pb_nCe_{(1-n)}][I]_3$, $[CS][Pb_nPr_{(1-n)}][I]_3$, $[CS][Pb_nNd_{(1-n)}][I]_3$, $[Cs][Pb_nPm_{(1-n)}][I]_3$, $[Cs][Pb_nGd_{(1-n)}][I]_3$, $[Cs][Pb_nTb_{(1-n)}][I]_3$, $[Cs][Pb_nHo_{(1-n)}][I]_3$, $[Cs][Pb_nEr_{(1-n)}][I]_3$, $[Rb][Pb][I]_3$, $[Rb][Pb_nSr_{(1-n)}][I]_3$, $[Rb][Pb_nMg_{(1-n)}][I]_3$, $[Rb][Pb_nCa_{(1-n)}][I]_3$, $[Rb][Pb_nBa_{(1-n)}][I]_3$, $[Rb][Pb_nEu_{(1-n)}][I]_3$, $[Rb][Pb_nYb_{(1-n)}][I]_3$, $[Rb][Pb_nTm_{(1-n)}][I]_3$, $[Rb][Pb_nLa_{(1-n)}][I]_3$, $[Rb][Pb_nCe_{(1-n)}][I]_3$, $[Rb][Pb_nPr_{(1-n)}][I]_3$, $[Rb][Pb_nNd_{(1-n)}][I]_3$, $[Rb][Pb_nPm_{(1-n)}][I]_3$, $[Rb][Pb_nGd_{(1-n)}][I]_3$, $[Rb][Pb_nTb_{(1-n)}][I]3$, $[Rb][Pb_nHo_{(1-n)}][I]_3$, $[Rb][Pb_nEr_{(1-n)}][I]_3$, $[K][Pb][I]_3$, $[K][Pb_nSr_{(1-n)}][I]_3$, $[K][Pb_nMg_{(1-n)}][I]_3$, $[K][Pb_nCa_{(1-n)}][I]_3$, $[K][Pb_nBa_{(1-n)}][I]_3$, $[K][Pb_nEu_{(1-n)}][I]_3$, $[K][Pb_nYb_{(1-n)}][I]_3$, $[K][Pb_nTm_{(1-n)}][I]_3$, $[K][Pb_nLa_{(1-n)}][I]_3$, $[K][Pb_nCe_{(1-n)}][I]_3$, $[K][Pb_nPr_{(1-n)}][I]_3$, $[K][Pb_nNd_{(1-n)}][I]_3$, $[K][Pb_nPm_{(1-n)}][I]_3$, $[K][Pb_nGd_{(1-n)}][I]_3$, $[K][Pb_nTb_{(1-n)}][I]_3$, $[K][Pb_nH_{(1-n)}][I]_3$, $[K][Pb_nEr_{(1-n)}][I]_3$, $[CH_3NH_3][Tm][I]_3$, $[CH_3NH_3][Tm_nSr_{(1-n)}][I]_3$, $[CH_3NH_3][Tm_nMg_{(1-n)}][I]_3$, $[CH_3NH_3][Tm_nCa_{(1-n)}][I]_3$, $[CH_3NH_3][Tm_nBa_{(1-n)}][I]_3$, $[CH_3NH_3][Tm_nEu_{(1-n)}][I]_3$, $[CH_3NH_3][Tm_nYb_{(1-n)}][I]_3$, $[CH_3NH_3][Tm_nLa_{(1-n)}][I]_3$, $[CH_3NH_3][Tm_nCe_{(1-n)}][I]_3$, $[CH_3NH_3][Tm_nPr_{(1-n)}][I]_3$, $[CH_3NH_3][Tm_nNd_{(1-n)}][I]_3$, $[CH_3NH_3][Tm_nPm_{(1-n)}][I]_3$, $[CH_3NH_3][Tm_nGd_{(1-n)}][I]_3$, $[CH_3NH_3][Tm_nTb_{(1-n)}][I]_3$, $[CH_3NH_3][Tm_nH_{(1-n)}][I]_3$, $[CH_3NH_3][Tm_nEr_{(1-n)}][I]_3$, $[Cs][Tm][I]_3$, $[Cs][Tm_nSr_{(1-n)}][I]_3$, $[Cs][Tm_nMg_{(1-n)}][I]_3$, $[Cs][Tm_nCa_{(1-n)}][I]_3$, $[Cs][Tm_nBa_{(1-n)}][I]_3$, $[Cs][Tm_nEu_{(1-n)}][I]_3$, $[Cs][Tm_nYb_{(1-n)}][I]_3$, $[Cs][Tm_nLa_{(1-n)}][I]_3$, $[Cs][Tm_nCe_{(1-n)}][I]_3$, $[Cs][Tm_nPr_{(1-n)}][I]_3$, $[Cs][Tm_nNd_{(1-n)}][I]_3$, $[Cs][Tm_nPm_{(1-n)}][I]_3$, $[Cs][Tm_nGd_{(1-n)}][I]_3$, $[Cs][Tm_nTb_{(1-n)}][I]_3$, $[Cs][Tm_nHo_{(1-n)}][I]_3$, $[Cs][Tm_nEr_{(1-n)}][I]_3$, or any combinations thereof. In some exemplary embodiments of the present invention, n may be a real number satisfying the condition of $0<n<1$. For example, n may be a real number satisfying the condition of $0<n\leq0.6$. In some exemplary embodiments of the present invention, n may be a real number satisfying the condition of $0.001\leq n\leq0.6$. In some exemplary embodiments of the present invention, n may be a real number satisfying the condition of $0.05\leq n\leq0.4$. However, exemplary embodiments of the present invention are not limited thereto.

The perovskite compound of Formula 1 may absorb at least part of light emitted from the light source. The light source is not limited to a particular type of light source, and thus the light source may be any type of light source. For example, the light source may be a light source that may emit light by applying an external voltage. In some exemplary embodiments of the present invention, the light source may be a fluorescent lamp, a light-emitting diode (LED), an organic LED, a quantum dot light-emitting diode (QLED), or any combination thereof. For example, the fluorescent lamp may include a cold cathode fluorescent lamp (CCFL) and/or an external electrode fluorescent lamp (EEFL). However, exemplary embodiments of the present invention are not limited thereto.

The light source may emit blue light (e.g., light having a wavelength range of from about 420 nm to about 490 nm) or UV light (e.g., light having a wavelength range of from about 300 nm to about 420 nm). For example, the light source may be a blue light-emitting diode emitting blue light, or a UV light-emitting diode emitting UV light. However, exemplary embodiments of the present invention are not limited thereto.

In some exemplary embodiments of the present invention, the light source of the lighting device may emit blue light, and the photoconversion layer may include a perovskite compound that absorbs the blue light emitted from the light source and emits light having a different wavelength range from that of the blue light.

For example, the light source may emit blue light, and the photoconversion layer may include a perovskite compound that absorbs the blue light and emits yellow light (e.g., light having a wavelength range of from about 540 nm to about 620 nm). Thus, the lighting device may emit white light as a result of combination of the blue light emitted from the light source and the yellow light emitted from the perovskite compound.

In some exemplary embodiments of the present invention, the photoconversion layer may be a thin film layer. The thin film layer may be a monocrystalline laminate including the perovskite compound that emits yellow light.

In some exemplary embodiments of the present invention, the photoconversion layer may be a thin film layer. The thin film layer may be a nanostructure that is less than about 500 nm and includes the perovskite compound that emits yellow light. The nanostructure may be in the form of particles, for example, nanoparticles, nanorods, nanowires, nanotubes, branched nanostructures, nanotetrapods, nanotripods, or nanobipods. These nanostructures may be surrounded by, for example, at least one ligand or matrix resin. The ligand or matrix resin may increase stability of the perovskite nanostructure and protect the perovskite nanostructure from harmful external conditions, such as high temperature, high strength, external gas, and/or moisture.

For example, the ligand may be a molecule having an amine group (e.g., oleylamine, triethylamine, hexylamine, or naphtylamine) or a polymer thereof, a molecule having a carboxyl group (e.g., oleic acid) or a polymer thereof, a molecule having a thiol group (e.g., butanethiol, hexanethiol, or dodecanethiol) or a polymer thereof, a molecule having a pyridine group (e.g., pyridine) or a polymer thereof, a molecule having a phosphine group (e.g., triphenylphosphine) or a polymer thereof, a molecule having a phosphine oxide group (example e.g., trioctylphosphine oxide) or a polymer thereof, a molecule having a carbonyl group (e.g., alkyl ketone) or a polymer thereof, a molecule having a benzene ring (e.g., benzene, or styrene) or a polymer thereof, or a molecular having a hydroxyl group (e.g., butanol, or hexanol) or a polymer thereof.

The matrix resin may include, for example, epoxy resin, silicon epoxy resin, silicon resin, polystyrene resin, (meth) acrylate resin, or any combination thereof. However, exemplary embodiments of the present invention are not limited thereto.

In some exemplary embodiments of the present invention, the light source of the lighting device may emit blue light, and the photoconversion layer may include a first perovskite compound that absorbs the blue light and emits green light (e.g., light having a wavelength range of from about 490 nm to about 570 nm) and a second perovskite compound that absorbs the blue light and/or green light and emits red light (e.g., light having a wavelength range of from about 570 nm to about 680 nm). Thus, the lighting device may emit white light as a result of combination of the blue light emitted from the light source, the green light emitted from the first perovskite compound, and the red light emitted from the second perovskite compound.

In some exemplary embodiments of the present invention, the light source of the lighting device may emit blue light, and the photoconversion layer may include a monofilm in which first and second perovskite compounds emitting green light and red light, respectively, are substantially uniformly dispersed. The first perovskite compound and the second perovskite compound may both be in the form of a nanostructure.

In some exemplary embodiments of the present invention, the light source of the lighting device may emit blue light, and the photoconversion layer may include a first layer including a first perovskite compound that absorbs the blue light and emits green light; and a second layer including a second perovskite compound that absorbs the blue light and/or green light and emits red light. The first layer may be arranged to receive at least part of the blue light emitted from the light source, and the second layer may be arranged to receive the blue light emitted from the light source and passed through the first layer and/or light emitted from the first layer. The first and second layers may be separate thin films. Each of the thin films may be a monocrystalline laminate including the perovskite compound or a nanostructure including the perovskite compound.

In some exemplary embodiments of the present invention, the light source may emit UV light, and the photoconversion layer may include a perovskite compound of Formula 1 that absorbs the UV light emitted from the light source and emits light having a different wavelength range from that of the UV light.

For example, the light source of the lighting device may emit UV light, and the photoconversion layer may include a first perovskite compound that absorbs the UV light and emits blue light, a second perovskite compound that absorbs the UV and/or blue light and emits green light and a third perovskite compound that absorbs the UV light, blue light, and/or green light, and emits red light. The lighting device may emit white light as a result of combination of the blue light emitted from the first perovskite compound, the green light emitted from the second perovskite compound, and the red light emitted from the third perovskite compound.

In some exemplary embodiments of the present invention, the light source of the lighting device may emit UV light, and the photoconversion layer may include a monofilm in which a first perovskite compound that absorbs the UV light and emits blue light, a second perovskite compound that absorbs the UV light and/or blue light and emits green light, and a third perovskite compound that absorbs the UV light, blue light, and/or green light, and emits red light are substantially uniformly dispersed. The first perovskite compound, the second perovskite compound, and the third perovskite compound may all have a nanostructure.

In some exemplary embodiments of the present invention, the light source of the lighting device may emit UV light, and the photoconversion layer may include a first layer including a first perovskite compound that absorbs the UV light and emits blue light and a second perovskite compound that absorbs the UV light and/or blue light and emits green light and a second layer including a third perovskite compound that absorbs the UV light, blue light, and/or green light, and emits red light. The first layer may be arranged to receive at least part of the UV light emitted from the light source, and the second layer may be arranged to receive the UV light emitted from the light source and passed through the first layer and/or light emitted from the first layer. The first layer may be a thin film. The thin film of the first layer may be a nanostructure including the first and second perovskite compounds. The second layer may be a thin film. The thin film of the second layer may be a monocrystalline laminate including the third perovskite compound or a nanostructure including the third perovskite compound.

In some exemplary embodiments of the present invention, the light source of the lighting device may emit UV light, and the photoconversion layer may include a first layer including a first perovskite compound that absorbs the UV light and emits blue light; and a second layer including a second perovskite compound that absorbs the UV light and/or blue light and emits green light, and a third perovskite compound that absorbs the UV light, blue light, and/or green light and emits red light. The first layer may be arranged to receive at least part of the UV light emitted from the light source, and the second layer may be arranged to receive the UV light emitted from the light source and passed through the first layer and/or light emitted from the first layer. The first layer may be a thin film. The thin film of the first layer may be a monocrystalline laminate including the first perovskite compound or a nanostructure including the first perovskite compound. The second layer may be a thin film. The thin film of the second layer may be a nanostructure including the second and third perovskite compounds.

In some exemplary embodiments of the present invention, the light source of the lighting device may emit UV light, and the photoconversion layer may include a first layer including a first perovskite compound that absorbs the UV light and emits blue light, a second layer including a second perovskite compound that absorbs the UV light and/or blue light and emits green light and a third layer including a third perovskite compound that absorbs the UV light, blue light, and/or green light, and emits red light. The first layer may be arranged to receive at least part of the UV light emitted from the light source. The second layer may be arranged to receive the UV light emitted from the light source and passed through the first layer and/or light emitted from the first layer. The third layer may be arranged to receive the UV light emitted from the light source and passed through the first and second layers, the light emitted from the first layer and passed through the second layer, and/or light emitted from the second layer. The first layer, the second layer, and the third layer may each be a thin film. The thin films of the first, second and/or third layers may be a monocrystalline laminate including the corresponding first, second or third perovskite compound. The thin films of the first, second and/or third layers may be a nanostructure including the corresponding first, second or third perovskite compound.

In some exemplary embodiments of the present invention, thicknesses of layers in a photoconversion layer and a mixed ratio of at least two perovskite compounds in a photoconversion layer are not specifically limited, and may be determined to be in an appropriate range based on desired optical characteristics of the lighting device.

The perovskite compound represented by Formula 1 may emit light having a variety of wavelength ranges by appropriate control of A, B, and X in Formula 1. For example, $[CH_3NH_3][Tm_{0.4}Eu_{0.6}][I]_3$ and $[Cs][Tm_{0.42}Eu_{0.58}][I]_3$ may emit red light, $[CH_3NH_3][Tm_{0.2}Eu_{0.8}][I]_3$ and $[Cs][Tm_{0.23}Eu_{0.77}][I]_3$ may emit green light, and $[CH_3NH_3][Tm_{0.05}Eu_{0.95}][I]_3$ and $[Cs][Tm_{0.05}Eu_{0.95}][I]_3$ may emit blue light. However, exemplary embodiments of the present invention are not limited thereto.

At least one layer in the photoconversion layer including a perovskite compound represented by Formula 1 may be prepared by depositing and heat-treating an A-containing precursor and a B-containing precursor onto a substrate (e.g., a target region of the substrate where the at least one layer is to be formed).

In the A-containing precursor and B-containing precursor, A and B may be the same as those defined in conjunction with Formula 1.

For example, A of the A-containing precursor may be selected from halides of A (e.g., $(A)(X^1)$), and B of the B-containing precursor may be selected from halides of B (e.g., $(B)(X^2)(X^3)$). In the halides represented by $(A)(X^1)$ and $(B)(X^2)(X^3)$, A and B may be the same as those defined herein, and $X^1$ to $X^3$ may each be independently selected from $F^-$, $Cl^-$, $Br^-$, or $I^-$.

In some exemplary embodiments of the present invention, at least one layer in the photoconversion layer including a perovskite compound represented by Formula 1 may be formed by depositing an A-containing precursor and a B-containing precursor onto a substrate and at substantially the same time performing thermal treatment (e.g., by a one-step method).

In some exemplary embodiments of the present invention, at least one layer in the photoconversion layer including a perovskite compound represented by Formula 1 may be formed by depositing an A-containing precursor and a B-containing precursor onto a substrate to form a precursor-containing layer and then thermally treating the precursor-containing layer (e.g., by a two-step method).

In some exemplary embodiments of the present invention, a layer(s) in the photoconversion layer including a perovskite compound represented by Formula 1 may be formed by depositing a mixture of the corresponding perovskite compounds onto a substrate and thermally treating a resulting structure.

In some exemplary embodiments of the present invention, at least one layer in the photoconversion layer including a perovskite compound represented by Formula 1 may be formed by depositing a mixture of the perovskite compound incorporated in a matrix resin onto a substrate and drying or thermally treating a resulting structure.

The thermal treatment to form the at least one layer in the photoconversion layer may be performed, for example, in a temperature range of from about 50° C. to about 800° C. for from about 1 minute to about 48 hours. However, exemplary embodiments of the present invention are not limited thereto.

In some exemplary embodiments of the present invention, the lighting device may include a barrier film on at least one surface of the photoconversion layer to prevent contact between the photoconversion layer and oxygen or moisture. The photoconversion layer including the barrier may increase the stability of the perovskite compound.

For example, the barrier film may be on a light-incident surface of the photoconversion layer (e.g., a surface receiving light emitted from the light source) and/or a light-emitting surface of the photoconversion layer (e.g., a surface through which light is emitted from the photoconversion layer). In some exemplary embodiments of the present invention, the barrier film may surround the entire photoconversion layer.

The barrier film may include, for example, polyester, polycarbonate, polyolefin, a cyclic olefin copolymer (COC), polyimide, or any combination thereof.

The barrier film may further include an inorganic coating film in the form of a monofilm or multilayered film. An inorganic material in the inorganic coating layer may include an inorganic oxide, for example, silica, alumina, titania, zirconia, or any combination thereof. The inorganic coating layer may inhibit permeation of oxygen or moisture, and thus may increase the ability of the barrier film to block oxygen and/or moisture.

The photoconversion layer may be arranged to receive at least part of the light emitted from the light source. For example the photoconversion layer may be arranged to directly receive at least part of the light emitted from the light source without intervening layers between the light source and the photoconversion layer. However, exemplary embodiments of the present invention are not limited thereto. For example, the lighting device may include an additional element between the light source and the photoconversion layer.

For example, the light source and the photoconversion layer may be in direct contact with one another. Thus, light emitted from the light source may be substantially instantly incident into the photoconversion layer.

In some exemplary embodiments of the present invention, the light source and the photoconversion layer may be separated from one another. For example, the light source and the photoconversion layer may be spaced from one another, with an additional element between the light source and the photoconversion layer. The additional element may be between the light source and the photoconversion layer, and the light source and the photoconversion layer may face each other. The additional element may be on a traveling path of light emitted from the light source and traveling toward the photoconversion layer.

For example, the additional element may be a light guide plate, a diffuser plate, an optical sheet for increasing optical characteristics such as luminance, a reflective film for reflecting light emitted from the light source to increase an efficiency of light emitted to outside the lighting device, or any combination thereof.

For example, the optical sheet may be a prism sheet, a microlens sheet, a brightness enhancement sheet, or any combination thereof. However, exemplary embodiments of the present invention are not limited thereto. Examples of the optical sheet may include any optical sheets having a desired function.

In some exemplary embodiments of the present invention, a light guide plate, a diffuser plate, a prism sheet, a microlens sheet, a brightness enhancement sheet, a reflective film, or any combination thereof may be between the light source and the photoconversion layer. The light guide plate, the diffuser plate, the prism sheet, the microlens sheet, the brightness enhancement sheet, the reflective film, or any combination thereof between the light source and the photoconversion layer may be arranged on a traveling path of light emitted from the light source toward the photoconversion layer.

In some exemplary embodiments of the present invention, a light guide plate, a diffuser plate, a prism sheet, a microlens sheet, a brightness enhancement sheet, a reflective film, or any combination thereof may be arranged above the photoconversion layer.

For example, the lighting device may include a diffuser plate above the light source. In this case, the photoconversion layer may be arranged between the light source and the diffuser plate or may be arranged above the diffuser plate. The diffuser plate and the photoconversion layer may be spaced from one another or may be in direct contact with each other.

In some exemplary embodiments of the present invention, the lighting device may include an optical sheet, in addition to the diffuser plate. When the lighting device includes a diffuser plate and an optical sheet, the lighting device may have a stack structure of, for example, a light source/photoconversion layer/diffuser plate/optical sheet, a light source/diffuser plate/photoconversion layer/optical sheet, or a light source/diffuser plate/optical sheet/photoconversion layer. The elements in each of the stack structures may be stacked in the stated order. However, exemplary embodiments of the present invention are not limited thereto.

In some exemplary embodiments of the present invention, the lighting device may include a light guide plate. The light guide plate may be arranged above the light source or at a side of the light source. The photoconversion layer may be arranged between the light source and the light guide plate or above the light guide plate. The light guide plate and the photoconversion layer may be spaced from one another or may be in direct contact with each other.

In some exemplary embodiments of the present invention, the lighting device may include a diffuser plate and/or an optical sheet above a surface of the light source, in addition to the light guide plate. For example, a diffuser plate and an optical sheet may be arranged in the stated order above the light guide plate. In this case, the photoconversion layer may be arranged between the light source and the light guide plate, between the light guide plate and the diffuser plate, between the diffuser plate and the optical sheet, or above the optical sheet.

In some exemplary embodiments of the present invention, the lighting device may include a reflective film that reflects light. The reflective film may be arranged between the light source and the photoconversion layer, or above the photoconversion layer. The reflective film and the photoconversion layer may be spaced from one another or may be in direct contact with each other.

In some exemplary embodiments of the present invention, the lighting device may include a light guide plate and a reflective film, in addition to the photoconversion layer. In this case, the light guide plate may be arranged between the photoconversion layer and the reflective film. However, exemplary embodiments of the present invention are not limited thereto.

Figure 2:
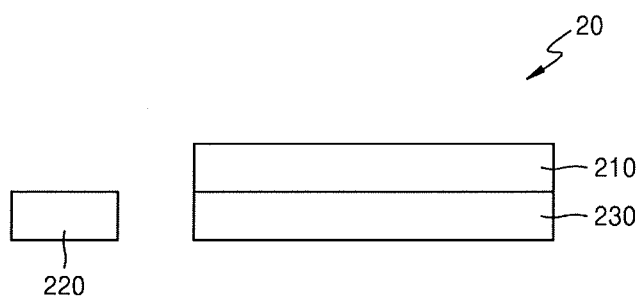

FIGS. 1 and 2 are schematic views illustrating structures of lighting devices according to exemplary embodiments of the present invention.

Referring to FIGS. 1 and 2, in lighting devices 10 and 20, light sources 121, 122, 123, and 220, and photoconversion layers 110 and 210 may be arranged such that that light emitted from the light sources 121, 122, 123, and 220 may be incident onto the photoconversion layers 110 and 210.

In the lighting device 10, the light sources 121, 122, and 123 may be arranged below the photoconversion layer 110, and thus light emitted upwards from the light sources 121, 122, and 123 may be incident onto the photoconversion layer 110.

In the lighting device 20, the light source 220 may be arranged at a side of the photoconversion layer 210. The lighting device 20 may include an additional element, for example, a light guide plate 230. The light guide plate 230 may increase the efficiency of the light emitted from the light source 220 onto the photoconversion layer 210.

A lighting device according to exemplary embodiments of the present invention may be used for a variety of purposes. For example, a lighting device according to some exemplary embodiments of the present invention may be used as a backlight unit (BLU) of a liquid display device, for indoor or outdoor lighting, stage lighting, or decorative lighting. However, exemplary embodiments of the present invention are not limited thereto.

A lighting device and a liquid crystal display (LCD) according to some exemplary embodiments of the present invention will be described in more detail below with reference to the following examples; however, exemplary embodiments of the present invention are not limited thereto.

EXAMPLES

Example 1

$CH_3NH_3I$, $TmI_2$, and $EuI_2$ were co-deposited on a glass substrate in a mole ratio of about 1:0.2:0.8 to form a precursor-containing layer including $CH_3NH_3I$, $TmI_2$, and $EuI_2$, followed by thermal treatment at about 100° C. for about 15 minutes to form a first layer including $(CH_3NH_3)(Tm_{0.2}Eu_{0.8})I_3$ with a thickness of about 40 nm. Next, $CH_3NH_3I$, $TmI_2$, and $EuI_2$ were co-deposited on the first layer in a mole ratio of about 1:0.4:0.6 to form a precursor-containing layer including $CH_3NH_3I$, $TmI_2$, and $EuI_2$, followed by thermal treatment at about 100° C. for about 15 minutes to form a second layer including $(CH_3NH_3)(Tm_{0.4}Eu_{0.6})I_3$ with a thickness of about 40 nm, thus forming a photoconversion layer.

Example 2

$CsI$, $TmI_2$, and $EuI_2$ were co-deposited on a glass substrate in a mole ratio of about 1:0.23:0.77 to form a precursor-containing layer including $CsI$, $TmI_2$, and $EuI_2$, followed by thermal treatment at about 150° C. for about 30 minutes to form a first layer including $(Cs)(Tm_{0.23}Eu_{0.77})I_3$ with a thickness of about 40 nm. Next, $CsI$, $TmI_2$, and $EuI_2$ were co-deposited on the first layer in a mole ratio of about 1:0.42:0.58 to form a precursor-containing layer including $CsI$, $TmI_2$, and $EuI_2$, followed by thermal treatment at about 150° C. for about 30 minutes to form a second layer including $(Cs)(Tm_{0.42}Eu_{0.58})I_3$ with a thickness of about 40 nm, thus forming a photoconversion layer.

Comparative Example 1

A solution including InP/ZnS ($\lambda_{em}$ 530 nm) quantum dots was spin-coated on a glass substrate at a speed of about 3,000 rpm for about 20 seconds to form a first layer having a thickness of about 40 nm. Next, a solution including InP/ZnS ($\lambda_{em}$ 650 nm) quantum dots was spin-coated on the first layer at a speed of about 3000 to 4000 rpm for about 30 seconds to form a second layer having a thickness of about 40 nm, thus forming a photoconversion layer.

Evaluation Example 1

A full width at half maximum (FWHM) of each of the photoconversion layers of Examples 1 and 2 and Comparative Example 1 was measured using an ISC PC1 spectrofluorometer. Photoluminescent (PL) spectra of the photoconversion layers were analyzed. The results are shown in Table 1.

Lighting devices including the photoconversion layers of Examples 1 and 2 and Comparative Example 1, respectively, were manufactured with a blue light-emitting diode as a light source. Color reproduction rates of the lighting devices including the photoconversion layers of Examples 1 and 2 and Comparative Example 1 relative to the standard National Television System Committee (NTSC) color reproduction rate were evaluated. The results are shown in Table 1.

TABLE 1

| Example | Compound in photoconversion layer | Emission color | FWHM (nm) | Color reproduction rate (%) |
|---|---|---|---|---|
| Example 1 | $(CH_3NH_3)(Tm_{0.2}Eu_{0.8})I_3$, | green | ~28 | 121 |
|  | $(CH_3NH_3)(Tm_{0.4}Eu_{0.6})I_3$ | red | ~30 |  |
| Example 2 | $(Cs)(Tm_{0.23}Eu_{0.77})I_3$, | green | ~23 | 132 |
|  | $(Cs)(Tm_{0.23}Eu_{0.77})I_3$ | red | ~30 |  |
| Comparative Example 1 | InP/ZnS quantum dot | green | ~40 | 105 |
|  | InP/ZnS quantum dot | red | ~50 |  |

From the result of Table 1, the perovskite compounds in the photoconversion layers of Examples 1 and 2 were found to have a narrower FWHM, compared with the photoconversion layer of Comparative Example 1 including the semiconductor quantum dots, indicating that the photoconversion layers of Examples 1 and 2 may provide a LCD with a more accurate color reproduction rate, compared to the photoconversion layer of Comparative Example 1.

According to some exemplary embodiments of the present invention, a lighting device having a photoconversion layer including a perovskite compound represented by Formula 1 may provide a more accurate color reproduction rate in a liquid crystal display (LCD).

It should be understood that embodiments described herein should be considered in a descriptive sense and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the present invention.

What is claimed is:

1. A lighting device comprising:
   a light source; and
   a photoconversion layer comprising a perovskite compound represented by Formula 1, the perovskite compound absorbing at least part of light emitted from the light source and emitting light having a different wavelength range from a wavelength range of the absorbed light:

[A][B][X]3 <Formula 1> wherein, in Formula 1,
   A is at least one monovalent organic cation, at least one a monovalent inorganic cation, or any combination thereof,
   B is at least one divalent inorganic cation, wherein B includes at least one divalent inorganic cation selected from La2+, Ce2+, Pr2+, Nd2+, Pm2+, Eu2+, Gd2+, Tb2+, Ho2+, Er2+, Tm2+, Yb2+, Lu2+, Be2+, Mg2+, Ca2+, Sr2+, Ba2+, Ra2+, and
   X is at least one monovalent anion.

2. The lighting device of claim 1, wherein A is (R1R2R3C)+, (R1R2R3R4N)+, (R1R2R3R4P)+, (R1R2R3R4As)+, (R1R2R3R4Sb)+, (R1R2N=C(R3)—NR4R6)+, a substituted or unsubstituted cycloheptatrienium, a substituted or unsubstituted nitrogen-containing 5-membered cyclic monovalent cation, a substituted or unsubstituted nitrogen-containing 6-membered cyclic monovalent cation, Li+, Na+, K+, Rb+, Cs+, Fr+, or any combination thereof,
   R1 to R5 are each independently selected from a hydrogen, a deuterium (-D), —F, —Cl, —Br, —I, a hydroxyl group, a substituted or unsubstituted C1-C60 alkyl group, a substituted or unsubstituted C2-C60 alkenyl group, a substituted or unsubstituted C2-C60 alkynyl group, a substituted or unsubstituted C1-C60 alkoxy group, a substituted or unsubstituted C6-C60 aryl group, or —N(Q1)(Q2),
   at least one substituent of the substituted cycloheptatrienium, the substituted nitrogen-containing 5-membered cyclic monovalent cation, and the substituted nitrogen-containing 6-membered cyclic monovalent cation is selected from a deuterium, —F, —Cl, —Br, —I, a hydroxyl group, a substituted or unsubstituted C1-C60 alkyl group, a substituted or unsubstituted C2-C60 alkenyl group, a substituted or unsubstituted C2-C60 alkynyl group, a substituted or unsubstituted C1-C60 alkoxy group, a substituted or unsubstituted C6-C60 aryl group, or —N(Q3)(Q4), and
   Q1 to Q4 are each independently selected from a hydrogen, a deuterium, a hydroxyl group, a C1-C60 alkyl group, a C2-C60 alkenyl group, a C2-C60 alkynyl group, a C1-C60 alkoxy group, or a C6-C60 aryl group.

3. The lighting device of claim 1, wherein A is (R1R2R3R4N)+, K+, Rb+, Cs+, or any combination thereof,
   R1 to R4 are each independently selected from a hydrogen, a deuterium, —F, —Cl, —Br, —I, a hydroxyl group, a C1-C20 alkyl group, a C1-C20 alkoxy group, or —N(Q1)(Q2), and
   Q1 and Q2 are each independently selected from a hydrogen, a deuterium, a hydroxyl group, a C1-C20 alkyl group, or a C1-C20 alkoxy group.

4. The lighting device of claim 1, wherein A is (NH4)+, (PH4)+, (AsH4)+, (SbH4)+, (NF4)+, (PF4)+, (NCl4)+, (PCl4)+, (CH3NH3)+, (CH3PH3)+, (CH3AsH3)+, (CH3SbH3)+, ((CH3)2NH2)+, ((CH3)2PH2)+, ((CH3)2AsH2)+, ((CH3)2SbH2)+, ((CH3)3NH)+, ((CH3)3PH)+, ((CH3)3AsH)+, ((CH3)3SbH)+, ((CH3CH2)NH3)+, ((CH3CH2)PH3)+, ((CH3CH2)AsH3)+, ((CH3CH2)SbH3)+, (CH2N2H4)+, (C7H7)+, (NH3OH)+, (NH3NH2)+, ((CH2)3NH2)+, (CH(NH2)2)+, (C3N2H5)+, (NC4H8)+, ((NH2)3C)+, K+, Rb+, Cs+, or any combination thereof.

5. The lighting device of claim 1, wherein B further includes Pb2+.

6. The lighting device of claim 1, wherein B comprises:
   Tm+2; and
   La2+, Ce2+, Pr2+, Nd2+, Pm2+, Eu2+, Gd2+, Tb2+, Ho2+, Er2+, Yb2+, Lu2+, Be2+, Mg2+, Ca2+, Sr2+, Ba2+, Ra2+, Pb2+, Sn2+, or any combination thereof.

7. The lighting device of claim 1, wherein X is at least one halide anion.

8. The lighting device of claim 1, wherein X is an iodide ion (I—).

9. The lighting device of claim 1, wherein the light source is a fluorescent lamp, a light-emitting diode (LED), an organic light-emitting diode (OLED), a quantum dot light-emitting diode (QLED), or any combination thereof.

10. The lighting device of claim 1, wherein the light source emits blue light or ultraviolet (UV) light.

11. The lighting device of claim 1, wherein the light source emits blue light, and
   the photoconversion layer comprises a perovskite compound that absorbs the blue light and emits yellow light.

12. The lighting device of claim 1, wherein the light source emits blue light, and the photoconversion layer comprises:
a first perovskite compound that absorbs the blue light and emits green light; and
a second perovskite compound that absorbs the blue light and/or green light and emits red light.

13. The lighting device of claim 1, wherein the light source emits blue light, and
the photoconversion layer comprises:
a first layer comprising a first perovskite compound that absorbs the blue light and emits green light; and
a second layer comprising a second perovskite compound that absorbs the blue light and/or green light and emits red light.

14. The lighting device of claim 1, wherein the light source emits UV light, and
the photoconversion layer comprises:
a first perovskite compound that absorbs the UV light and emits blue light;
a second perovskite compound that absorbs the UV light and/or blue light and emits green light; and
a third perovskite compound that absorbs the UV light, blue light, and/or green light, and emits red light.

15. The lighting device of claim 1, wherein the light source emits UV light, and
the photoconversion layer comprises:
a first layer comprising a first perovskite compound that absorbs the UV light and emits blue light and second perovskite compound that absorbs the UV light and/or blue light and emits green light; and a second layer comprising a third perovskite compound that absorbs the UV light, blue light, and/or green light, and emits red light, or
a first layer comprising a first perovskite compound that absorbs the UV light and emits blue light; and a second layer comprising a second perovskite compound that absorbs the UV light and/or blue light and emits green light, and a third perovskite compound that absorbs the UV light, blue light, and/or green light, and emits red light.

16. The lighting device of claim 1, wherein the light source emits UV light, and
the photoconversion layer comprises:
a first layer comprising a first perovskite compound that absorbs the light and emits blue light;
a second layer comprising a second perovskite compound that absorbs the UV light and/or blue light and emits green light; and
a third layer comprising a third perovskite compound that absorbs the UV light, blue light, and/or green light, and emits red light.

17. The lighting device of claim 1, wherein the photoconversion layer is in direct contact with at least one surface of the light source; or
the light source and the photoconversion layer are separated from one another.

18. The lighting device of claim 1, further comprising a light guide plate, a diffuser plate, a prism sheet, a microlens sheet, a luminance enhancement sheet, a reflective film, or any combination thereof between the light source and the photoconversion layer.

19. The lighting device of claim 1, further comprising a light guide plate, a diffuser plate, a prism sheet, a microlens sheet, a luminance enhancement sheet, a reflective film, or any combination thereof above the photoconversion layer.

* * * * *